United States Patent [19]
Entani

[11] Patent Number: 5,371,741
[45] Date of Patent: Dec. 6, 1994

[54] METHOD AND ARRANGEMENT OF MULTIPLEXING SERIAL DATA USING WIRED-OR

[75] Inventor: Naruto Entani, Tokyo, Japan

[73] Assignee: NEC Corporation, Tokyo, Japan

[21] Appl. No.: 980,033

[22] Filed: Nov. 23, 1992

[30] Foreign Application Priority Data

Nov. 22, 1991 [JP] Japan .................... 3-308014

[51] Int. Cl.$^5$ ................................. H04J 3/02
[52] U.S. Cl. ................................ 370/112; 327/407
[58] Field of Search ............... 370/112, 85.1; 328/104, 328/105; 307/243, 244

[56] References Cited

U.S. PATENT DOCUMENTS

| | | | |
|---|---|---|---|
| 3,920,962 | 11/1975 | Mayer et al. | 328/104 |
| 3,961,140 | 6/1976 | Carbrey | 370/112 |
| 4,531,211 | 7/1985 | Hadziomerovic | 370/112 |
| 4,949,052 | 8/1990 | Chigira | 328/104 |

*Primary Examiner*—Douglas W. Olms
*Assistant Examiner*—Min Jung
*Attorney, Agent, or Firm*—Sughrue, Mion, Zinn, Macpeak & Seas

[57] ABSTRACT

A method and arrangement of multiplexing a plurality of serial data using wired-OR, are disclosed. The serial data are respectively generated from a plurality of serial data generators in a predetermined order. When the serial data from the serial data generators are interrupted, the transmission pause for a first predetermined time duration is detected. Following this, a serial data generation pause pulse is generated at each of the serial data generators. Subsequently, in response to the serial data generator pause pulse, the serial data is generated from one of the serial data generators according to the predetermined order. A reset signal issues when a predetermined number of serial data generating pause pulses is generated within a second predetermined time duration. In response to the reset signal thus generated, the predetermined order is initialized. Subsequently, the serial data are generated and multiplexed according to the predetermined order initialized.

6 Claims, 9 Drawing Sheets

METHOD AND ARRANGEMENT OF MULTIPLEXING SERIAL DATA USING WIRED-OR

BACKGROUND OF THE INVENTION

1. Field of the Invention

The present invention relates generally to a method and arrangement of multiplexing a plurality of serial data using "wired-OR" connection. The plurality of serial data, before being multiplexed, are generated from the corresponding parallel data via parallel/serial conversion.

2. Description of the Prior Art

It is known in the art to multiplex or combine a plurality of serial data in the same transmission medium using a so called "wired-OR" connection.

Before turning to the instant invention it is deemed preferable to discuss, with reference to FIGS. 1-6, a known arrangement of multiplexing a plurality of serial data using "wired-OR" coupling.

Figure 1:
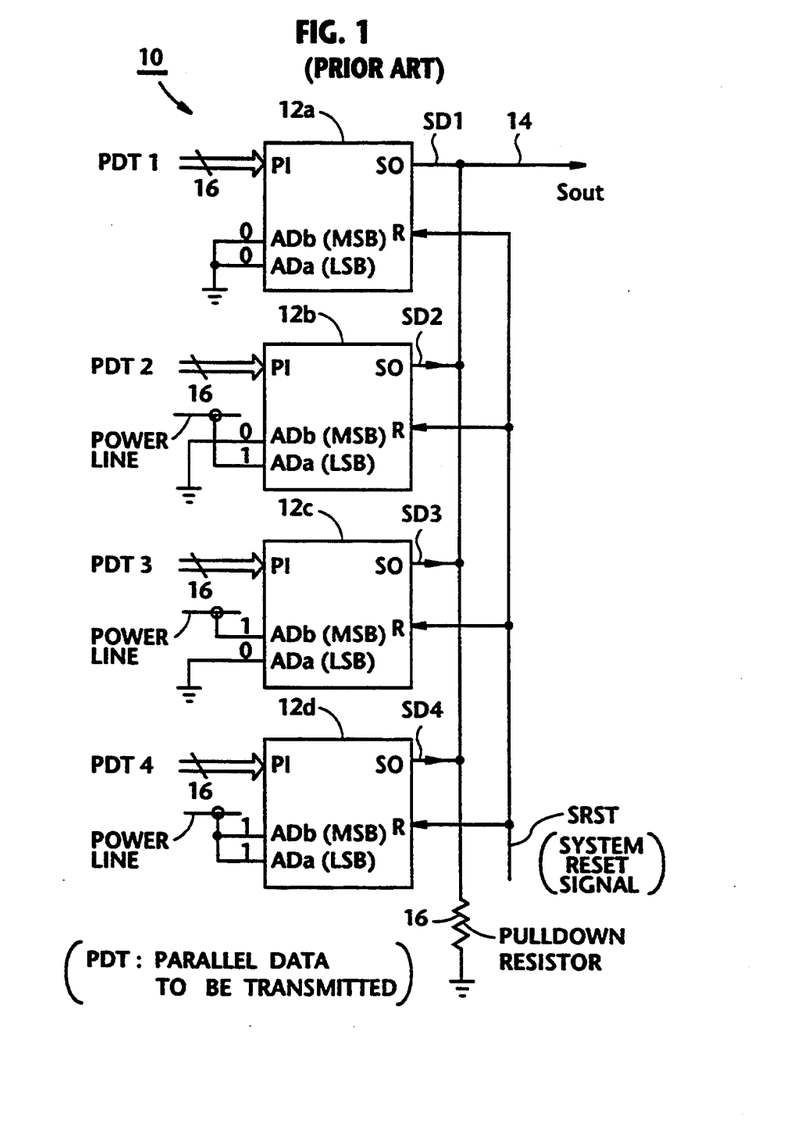
FIGS. 1–3 are block diagrams which show the prior art arrangement discussed in the opening paragraphs of the instant disclosure.

Reference is made to FIG. 1, wherein there is shown an overall arrangement of a multiplexor 10 in block diagram form. The multiplexor 10 includes four circuit units 12a-12d arranged in parallel. Each of the units 12a-12d, which may be configured using LSI (Large Scale Integration) techniques, is provided with a parallel data input PI, two address inputs ADa and ADb, a serial data output SO, and a reset terminal R.

The units 12a-12d are arranged to convert respectively the parallel data PDT1-PDT4 applied thereto at the inputs PIs into the corresponding serial data which are respectively outputted as SD1-SD4 in a predetermined transmission order.

Each pair of the address inputs ADa and ADb of the units 12a-12d, received address bits (2 bits in this instance) which are used to discriminate or specify one of the units 12a-12d in order to define the predetermined transmission order. The address input ADa receives LSB (least significant bit) while the address input ADb is supplied with MSB (most significant bit).

The circuit units 12a-12d are reset, by a system reset signal SRST, at the beginning of the operation of the system including the multiplexor 10 and, subsequently, receive respectively four parallel data PDT1-PDT4. The units 12a-12d are arranged to convert the parallel data PDT1-PDT 4 into corresponding serial data SD1-SD4 and then transmits them in the predetermined order as an output Sout over a transmission line 14. Each of the parallel data PDT1-PDT4 includes 16 bits in this case.

A pulldown resistor 16 is provided between ground and each of the serial data outputs SO. Accordingly, each of the units 12a-12d acquires ground level potential in the case where there is no output from each of the units 12a-12d.

Figure 2:
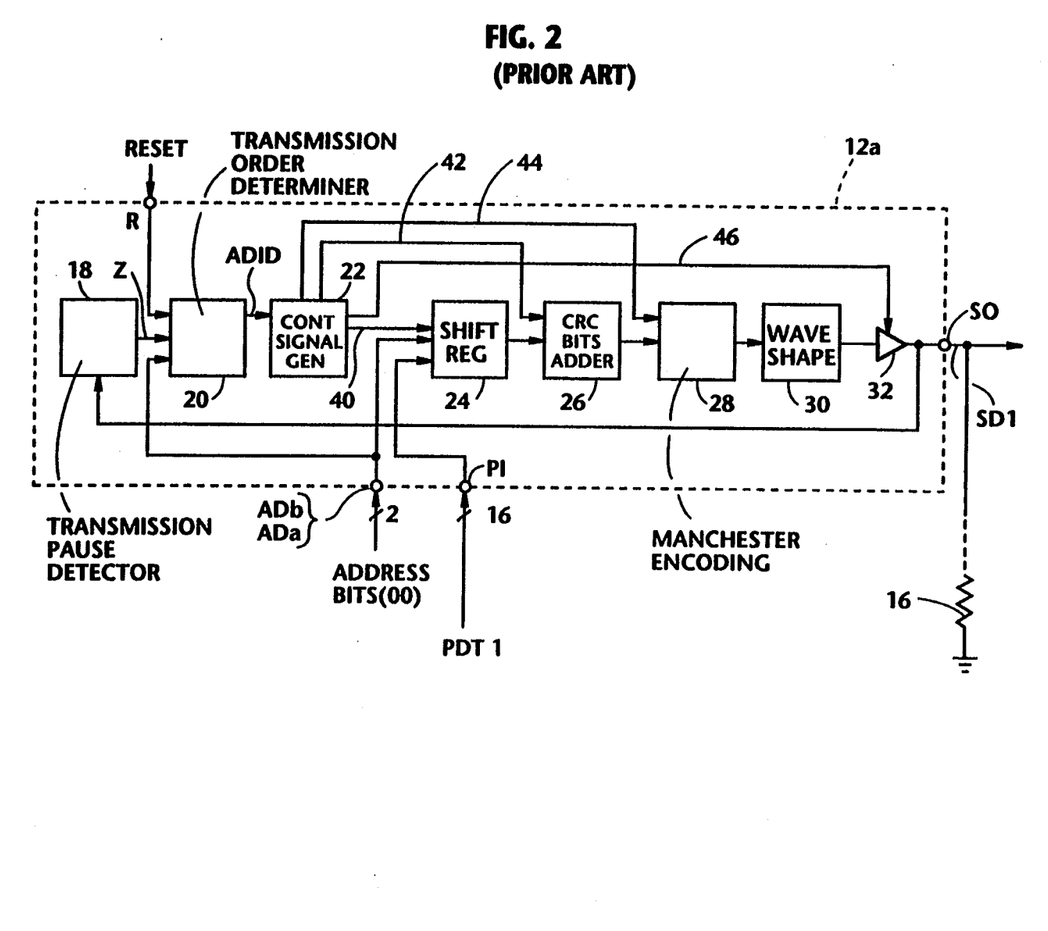

FIG. 2 is a block diagram which shows the arrangement of the circuit unit 12a in detail. It should be noted that each of the units 12b-12d is configured in exactly the same manner as the unit 12a. The FIG. 2 arrangement includes, a transmission pause detector 18, a transmission order determiner 20, a control signal generator 22, a shift register 24, a cyclic redundancy code (CRC) bits adder 26, a manchester encoder 28, a wave shaper 30, and a driver 32, all of which are coupled as illustrated.

Figure 3:
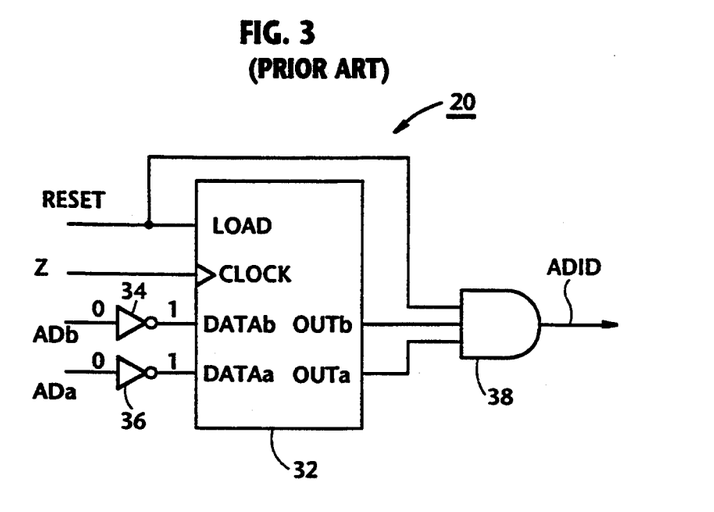

FIG. 3 is a block diagram showing the transmission order determiner 20 of FIG. 2 in detail. As shown, the determiner 20 includes a 2-bit pre-loadable up-counter 32, two inverters 34 and 36, and an AND gate 38. Each of the counterparts of the units 12b-12d is configured in exactly the same manner as shown in FIG. 3.

Figure 4:
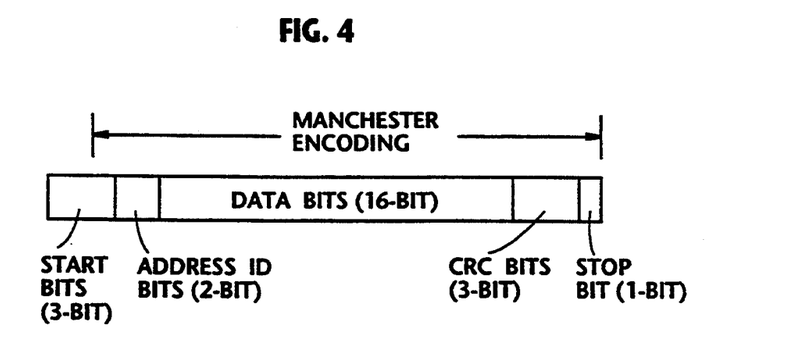
FIG. 4 is a chart showing a code format which is used with both the prior art and the instant invention.

FIG. 4 is a chart showing a code format of each of the serial data SD1-SD4 to be multiplexed. As shown, the code format of FIG. 4 includes 25 bits in total and begins with start bits (3-bit) which are followed by address ID bits (2-bit), data bits (16-bit), CRC bits (2-bit) and a stop bit. The 3rd to 25th bits of the code format are manchester encoded.

The operations of the FIG. 1 arrangement will be discussed with reference to FIGS. 2-4 and a timing chart shown in FIG. 5.

When the system reset signal SRST goes high at time point T0, each of the units 12a-12d acquires the corresponding address bits at the corresponding 2-bit uncounter (viz., preloading the initial counter content). The two inverters (34, 36 in the case of the unit 12a) are provided prior to the data inputs DATAa and DATAb of the counter (32 in the case of unit 12a). Accordingly, the up-counters of the units 12a-12d are initially set as shown below:

Up-counter 32 of the unit 12a : 11
Up-counter (not shown) of the unit 12b: 10
Up-counter (not shown) of the unit 12c: 01
Up-counter (not shown) of the unit 12d: 00

Thus, an address ID (Identification) signal ADID, which is the output of the AND gate 38 of the unit 12a, assumes a high level (viz., logic 1) at time point T0 when the system reset signal SRST goes hig. (It should be noted that time delays of signal propagation via elements are ignored for the purposes of simplifying the time charts of the instant disclosure.) It is understood that each of the AND gates of the units 12b-12d, which correspond to and the AND gate 38 of FIG. 3, continues to issue a low level (viz., logic 0) at time point T0.

In FIG. 2, the ADID is applied to the control signal generator 22 which in turn issues the start bits and then the stop bit over a line 40. The shift register 24 receives the start bits, the address ID bits (00), data bits, and the stop bit in this order. The output of the shift register 24 is applied to the CRC bits adder 26 which inserts the CRC bits between the data bits and the stop bit in response to a control signal applied from the control signal generator 22 over a line 42. The CRS bits are known in the art and further are not directly concerned with the present invention, and hence the description thereof will be omitted.

The encoder 28 is arranged to manchester encode part of the output of the CRC bits adder 26 (viz., the 3rd to 25th bits) in response to a control signal applied from the control signal generator 22 over a line 44. Subsequently, the output of the manchester encoder 28 undergoes wave shaping at the wave shaper 30 and then is applied to the serial data output SO via the driver 32. At this time, the driver 32 has been rendered active by a control signal from the control signal generator 22 via a line 46.

Figure 5:
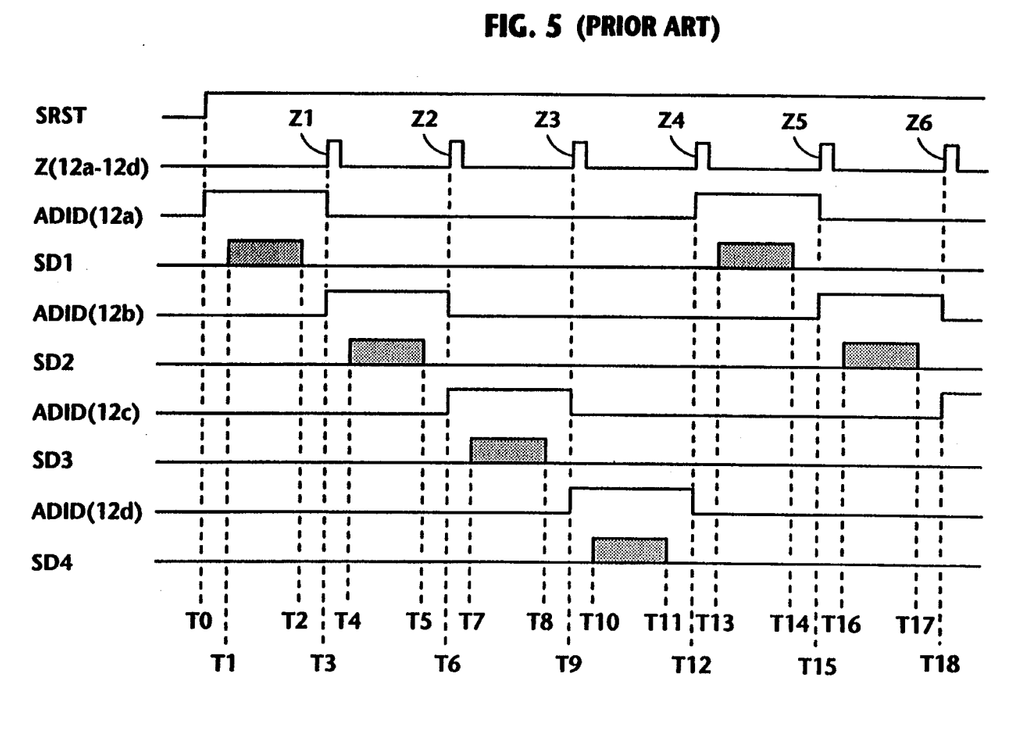
FIGS. 5–6 are timing charts for discussing the operations of the prior art of FIGS. 1–3.
Figure 6:
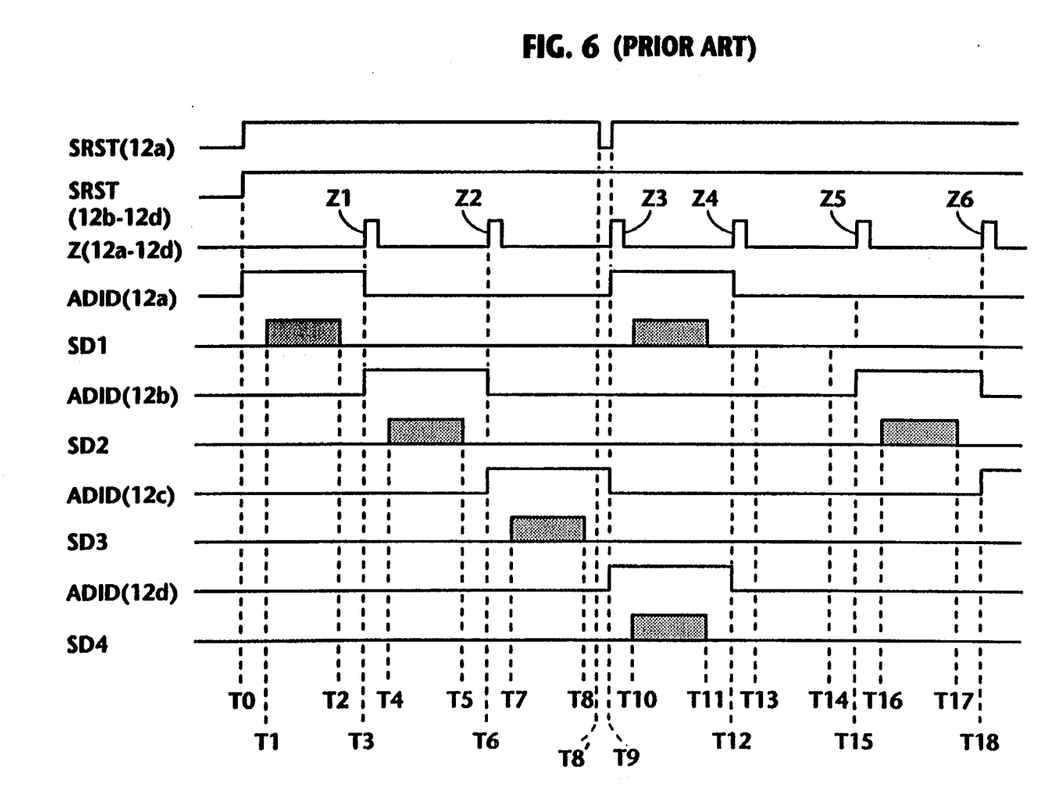

The serial data SD1 appears at the output SO of the unit 12a between time points T1-T2 as shown in FIG. 5. In the event that the serial data SD1 terminates at time point T2, the potential at the output terminal SO falls down to ground via the pulldown resistor 16. When the transmission pause detector 18 detects that the ground potential at the output terminal SO continues for a predetermine time duration, the detector 18 applies, at time point T3, a transmission pause detection pulse Z (Z1) to the counter 32 of the transmission order determiner 20. The pause detection pulse Z (Z1) is used to count up the contents (00 in this instance) by one binary number (viz., counts up to 01). Accordingly, the signal ADID of the unit 12a assumes a low level (viz., logic 0).

Similarly, each of the transmission pause detectors (not shown) of the units 12b–12d detects the transmission pause (interruption) and generates the pause detection pulses Z1 at time point T3. In this instance, only the unit 12b generates the serial data between time points T4–T5.

Subsequently, the units 12c, 12d generate the serial data SD3, SD4 in response to transmission pause pulses Z2 and Z3, respectively. After one cycle of the serial data generations of the units 12a–12d is completed, the units 12a–12d generate the serial data SD1–SD4 during the next cycle in response to transmission pause detection pulses Z4, Z5, Z6, . . . at time points T12, T15, T18, . . . respectively.

As mentioned above, once the system reset signal SRST goes high, the units 12a–12d successively generate the serial data thereof according to the predetermined order in response to the occurrences of the transmission pause pulses Z1, Z2, Z3, . . . In other words, when the system including the multiplexor 10 initiates the operations thereof, the system reset signal SRST continues to hold a logic 1 until the system is de-energized. Therefore, the above mentioned prior art has encountered the problem which will be discussed with reference to a timing chart shown in FIG. 6.

It is difficult that threshold levels of the units 12a–12d for detecting the system reset signal SRST are not fixed to the same level. Therefore, if the unit 12a detects that the system reset signal SRST falls down and then goes high at time points T8' and T9 due to external noises, then the predetermined transmission order of the unit 12a is disturbed. This means that the serial data collision is invited during time points T10–T11 and continues in the following cycles. The prior art is unable to correct these problems until the overall system is awkwardly initialized. This means that a long time passes until restoring the overall system to the correct operations.

SUMMARY OF THE INVENTION

It is an object of the present invention to provide an arrangement and method of multiplexing transmit data using wired-OR with self restoring functions in the event that the transmission order is disturbed due to noises.

A first aspect of the present invention comes in a method of multiplexing, using wired-OR, a plurality of serial data which are respectively generated from a plurality of serial data generators in a predetermined order, comprising the steps of: (a) detecting interruption of the generation of the serial data from the plurality of serial data generators for a first predetermined time duration; (b) issuing a serial data generation pause pulse at each of the plurality of serial data generators; (c) generating, in response to the serial data generator pause pulse, the serial data from one of the plurality of serial data generators according to the predetermined order; (d) issuing a reset signal when a predetermined number of serial data generating pause pulses issues for a second predetermined time duration; and (e) initializing, in response to the reset signal, the predetermined order and generating the plurality of serial data according to the predetermined order.

A second aspect of the present invention comes in an arrangement of multiplexing, using wired-OR, a plurality of serial data which are respectively generated from a plurality of serial data generators in a predetermined order, each of the plurality of serial data generators comprising: first means for detecting interruption of the generation of the serial data from the plurality of serial data generators for a first predetermined time duration, the first means issuing a serial data generation pause pulse; and second means for generating, in response to the serial data generator pause pulse, the serial data according to the predetermined order, wherein the first means issues a reset signal when a predetermined number of serial data generating pause pulses issues for a second predetermined time duration, and wherein the second means initializes, i response to the reset signal, the predetermined order and generating the serial data according to the predetermined order.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 7:
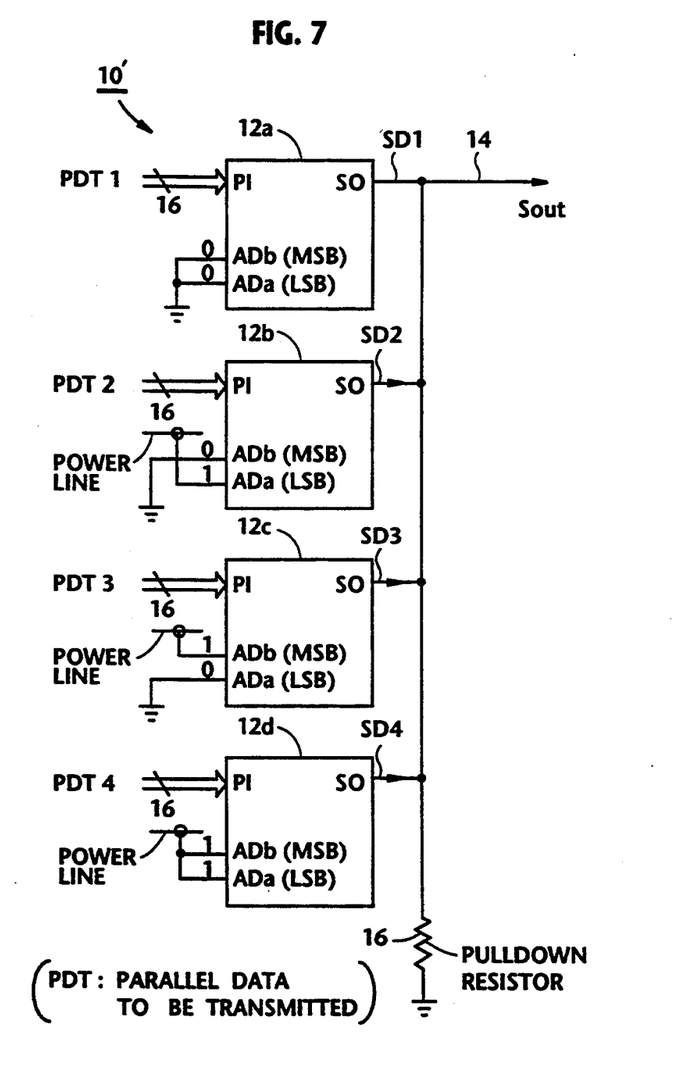
FIG. 7 is a block diagram showing an overall arrangement of the present invention.

Reference is now made to FIG. 7, there is shown an overall arrangement of a multiplexor 10' according to the present invention. The arrangement of FIG. 7 is identical with that of FIG. 1 except that the former arrangement is not supplied with the system reset signal SRST as in the FIG. 1 arrangement. Throughout the remainders of the disclosure, the blocks which have been referred to in the opening paragraphs are depicted by like numerals merely for the convenience of descriptions. The circuit units 12a–12d of FIG. 7 are essentially identical with one another as in FIG. 1.

Figure 8:
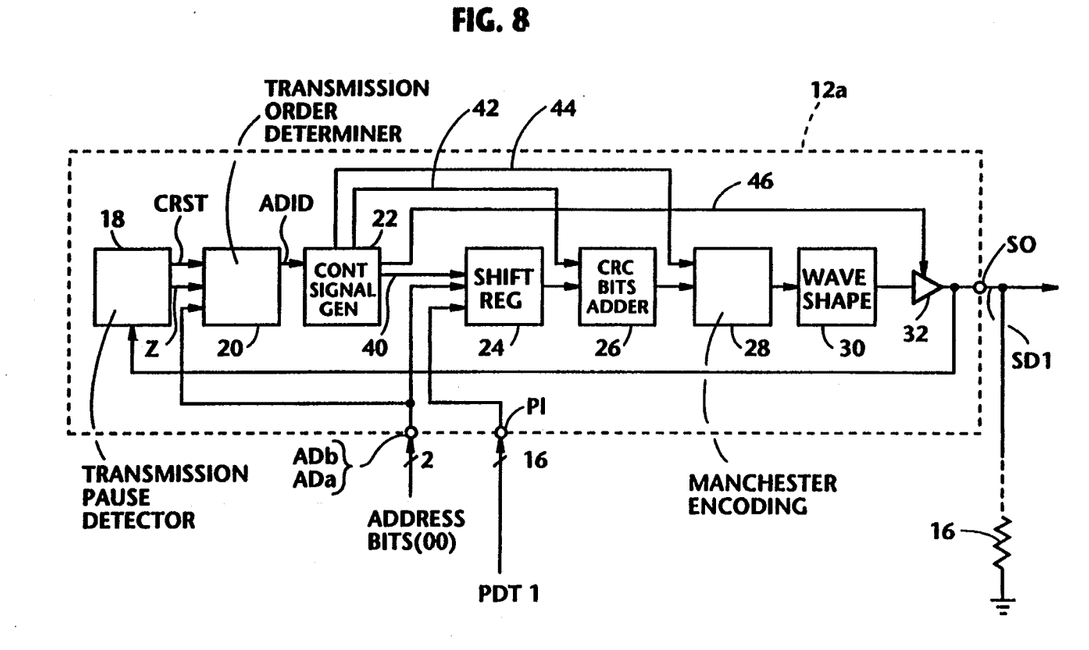
FIG. 8 is a block diagram of a transmission order determiner of FIG. 7.

FIG. 8 is a block diagram showing the details of the circuit unit 12a of FIG. 7. A counter reset signal CRST is applied, from the transmission pause detector 18, to the transmission order determiner 20 in lieu of the system reset signal SRST of FIG. 1. Other than this, the arrangement of FIG. 8 is identical with that of FIG. 2 and, accordingly redundant descriptions thereof will be omitted for brevity.

Figure 9:
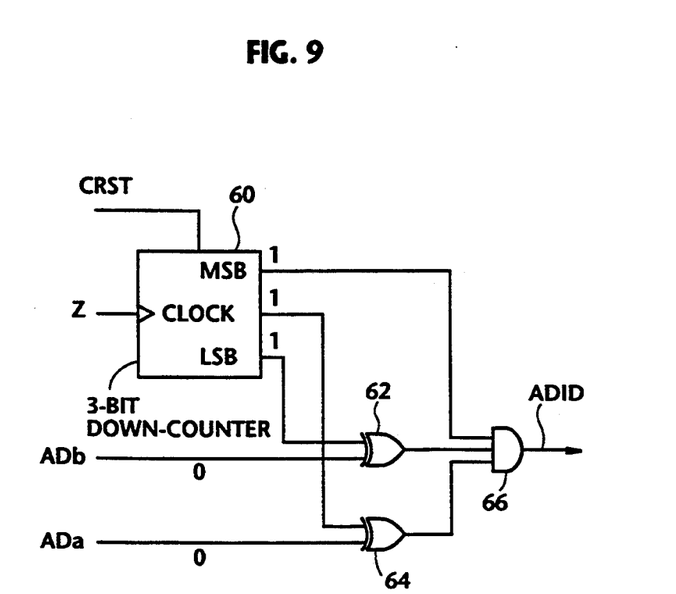
FIG. 9 is a block diagram of one block of FIG. 8.

FIG. 9 shows a block diagram of the transmission order determiner 20 of FIG. 8. As shown, the determiner 20 includes a 3-bit down-counter 60, two exclusive-OR gates 62 and 64, and an AND gate 66. The down-counter 60 is initialized by the counter reset signal CRST. When initialized by CRST, the counter 60 is reset to "111" and counts down in response to every occurrence of pause detection pulses Z. It should be noted that the transmission order determiner of each of the other units 12b–12d is configured in exactly the same manner as shown in FIG. 9.

The operations of the arrangements of FIGS. 7–9 will be described with reference to FIG. 10.

Although not shown in FIGS. 7 and 8, when the multiplexer 10' is initially energized, the counter reset signal CRST outputted from the transmission pause detector 18 goes high at time point T0. Thus, each of the 3-bit down-counters of the units 12a–12d is initialized to the binary number "111".

Figure 10:
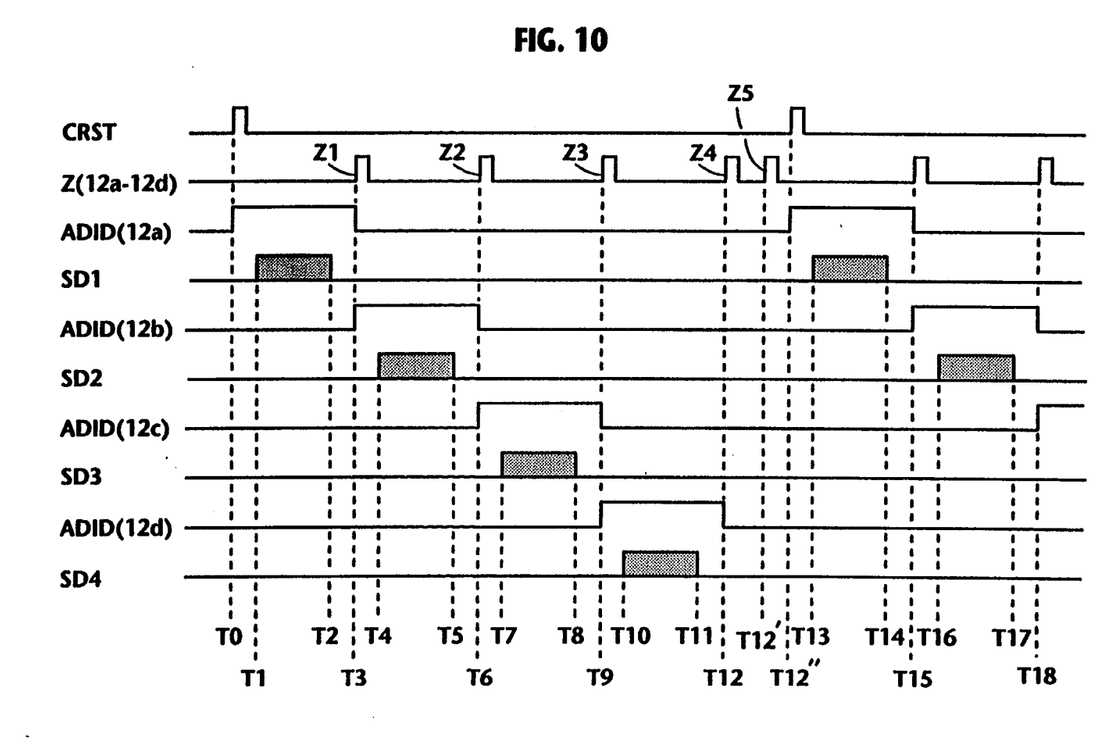
FIG. 10 is a timing chart for discussing the operations of the instant invention.

Each of the down-counters of the units 12a–12d counts down in response to each of the occurrences that the transmission pause detection signal Z goes high at Z1, Z2, Z3 and Z4 (viz., time points T3, T6, T9 and T12 respectively) as shown in FIG. 10. In more specific terms, each of the down-counters of the units 12a–12d counts down as follows:

"110+ in response to Z1;
"101" in response to Z2;
"100" in response to Z3; and
"011" in response to Z4.

The units 12a–12d are respectively identified by the address ID bits "00", "01", "10" and "11". It is understood therefore that:

a) the output of the AND gate 66 of the unit 12a assumes a logic 1 in response to the reset signal CRST which goes high;

(b) the output of the AND gate (not shown) of the unit 12b assumes a logic 1 in response to Z1;

(c) the output of the AND gate (not shown) of the unit 12c assumes a logic 1 in response to Z2;

(d) the output of the AND gate (not shown) of the unit 12d assumes a logic 1 in response to Z3; and (e) the output of each of the AND gates of all the units 12a–12d does not assume a logic 1 even if Z4 occurs.

In the above mentioned case (e), there is not serial data SD1–SD4 appearing at the outputs SOs (FIG. 7). In the event that the transmission pause continues, the transmission pause detector 18 issues a pulse Z6 at time point T12'. The pulse Z5 further counts down the counters of the units 12a–12d. However, the output of each of the AND gates of all the units 12a–12d does not assumes a logic 1 as in the case of the occurrence of Z4. Immediately thereafter, the detector 18 issues the counter reset pulse CRST at time point T12". Thus, the down-counters of all the units 12a–12d are initialized.

The timing charts of the serial data SD1–SD4 and the address IDs (12a–12d), will not be referred to in that they have been described in the opening paragraphs of the instant disclosure.

As above mentioned, the counter reset signal CRST is produced each time the units 12a–12d complete one cycle of serial data generation. Accordingly, even if one of the units 12a–12d erroneously counts down in response to a noise, the serial data collision or crash over the transmission line does not affect the next cycle of serial data generation.

It will be understood that the above disclosure is only representative of one possible embodiment of the present invention and that the concept on which the present invention is based is not specifically limited thereto.

What is claimed is:

1. A method of multiplexing, using wired-OR, a plurality of serial data which are respectively generated from a plurality of serial data generators in a predetermined order, comprising the steps of:

(a) detecting a pause of data generation of said serial data from said plurality of serial data generators for a predetermined time duration;

(b) issuing a first serial data generation pause pulse at each of said plurality of serial data generators if said pause of data generation is detected;

(c) generating, in response to said first serial data generation pause pulse, the serial data from one of said plurality of serial data generators according to said predetermined order;

(d) issuing a reset signal if a second serial data generation pause pulse issues following said first serial data generation pause pulse; and initializing, in response to said reset signal, said predetermined order and generating said plurality of serial data according to said predetermined order.

2. A method as claimed in claim 1, further including a plurality of said second serial data generation pause pulses.

3. An arrangement of multiplexing, using wired-OR, a plurality of serial data which are respectively generated from a plurality of serial data generators in a predetermined order, each of said plurality of serial data generators comprising:

first means for detecting a pause of data generation of said serial data from said plurality of serial data generators for a predetermined time duration, said first means issuing a first serial data generation pause pulse if said pause of data generation is detected; and second means for generating, in response to said first serial data generation pause pulse, the serial data according to said predetermined order, wherein said first means issues a reset signal if a second serial data generation pause pulse issues following said first serial data generation pause pulse, and wherein said second means initializes, in response to said reset signal, said predetermined order and generates the serial data according to said predetermined order.

4. An arrangement as claimed in claim 3, further including a plurality of said second generation pause pulses.

5. An arrangement as claimed in claim 3, wherein said second means receives parallel data and converts same into a corresponding serial data.

6. An arrangement as claimed in claim 3, wherein data indicative of said predetermined order in includes in the serial data.

* * * * *

UNITED STATES PATENT AND TRADEMARK OFFICE
CERTIFICATE OF CORRECTION

PATENT NO.   : 5,371,741
DATED        : December 6, 1994
INVENTOR(S)  : ENTANI

It is certified that error(s) appears in the above-identified patent and that said Letters Patent is hereby corrected as shown below:

Column 2, line 31, change "hig" to --high--.

Column 4, line 16, change "i" to --in--.

Column 5, line 44, change "Z6" to --Z5--.

Signed and Sealed this

Eleventh Day of April, 1995

Attest:

BRUCE LEHMAN

*Attesting Officer*   *Commissioner of Patents and Trademarks*